United States Patent
Shindo

(10) Patent No.: US 9,589,822 B2
(45) Date of Patent: Mar. 7, 2017

(54) SUBSTRATE TRANSFER METHOD WITH A SECOND POSITIONING STEP

(71) Applicant: TOKYO ELECTRON LIMITED, Tokyo (JP)

(72) Inventor: Takehiro Shindo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 157 days.

(21) Appl. No.: 14/324,909

(22) Filed: Jul. 7, 2014

(65) Prior Publication Data

US 2015/0016936 A1    Jan. 15, 2015

(30) Foreign Application Priority Data

Jul. 9, 2013 (JP) ................................. 2013-143899

(51) Int. Cl.
  *H01L 21/68* (2006.01)
  *H01L 21/677* (2006.01)
  *H01L 21/67* (2006.01)

(52) U.S. Cl.
  CPC ........ *H01L 21/68* (2013.01); *H01L 21/67109* (2013.01); *H01L 21/67742* (2013.01); *H01L 21/67754* (2013.01)

(58) Field of Classification Search
  CPC .............................................. H01L 21/67754
  See application file for complete search history.

(56) References Cited

U.S. PATENT DOCUMENTS

| | | | | | |
|---|---|---|---|---|---|
| 5,273,244 | A | * | 12/1993 | Ono ................. | H01L 21/67781 211/1.57 |
| 5,562,387 | A | * | 10/1996 | Ishii ................. | H01L 21/67781 414/937 |
| 5,989,346 | A | * | 11/1999 | Hiroki .............. | H01L 21/67766 414/938 |
| 9,214,369 | B2 | * | 12/2015 | Vopat ............... | H01L 21/67201 |
| 2007/0274811 | A1 | * | 11/2007 | Murata ............ | H01L 21/67754 414/217 |
| 2008/0159832 | A1 | * | 7/2008 | Mitsuyoshi ....... | H01L 21/67781 414/217 |
| 2009/0087932 | A1 | | 4/2009 | Kondoh | |

(Continued)

FOREIGN PATENT DOCUMENTS

JP    2008-300609 A    12/2008
JP    2009-88222 A    4/2009

*Primary Examiner* — Gerald McClain
(74) *Attorney, Agent, or Firm* — Rothwell, Figg, Ernst & Manbeck, P.C.

(57) ABSTRACT

A substrate transfer method includes a step of placing a first and a second substrate on a first and a second alignment part which are arranged to be vertically spaced from each other by using a first and a second pick. The method further includes a first positioning step of positioning the first pick at a first reception position determined based on an alignment position for the first substrate, a first receiving step of receiving the first substrate from the first alignment part by moving the first pick. The method further includes a second positioning step of positioning the second pick at a second reception position determined based on an alignment position for the second substrate, and a second receiving step of receiving the second substrate from the second alignment part by moving the second pick.

6 Claims, 16 Drawing Sheets

(56) References Cited

U.S. PATENT DOCUMENTS

| | | | | |
|---|---|---|---|---|
| 2014/0056679 A1* | 2/2014 | Yamabe | ............ | H01L 21/67742 414/749.1 |
| 2014/0210224 A1* | 7/2014 | Hashimoto | ....... | H01L 21/67742 294/213 |
| 2015/0016935 A1* | 1/2015 | Hashimoto | ....... | H01L 21/67742 414/744.5 |

* cited by examiner

US 9,589,822 B2

SUBSTRATE TRANSFER METHOD WITH A SECOND POSITIONING STEP

CROSS-REFERENCE TO RELATED APPLICATIONS

This application claims priority to Japanese Patent Application No. 2013-143899 filed on Jul. 9, 2013, the entire contents of which are incorporated herein by reference.

FIELD OF THE INVENTION

Various aspects and embodiments of the present invention relate to a substrate transfer method and device.

BACKGROUND OF THE INVENTION

In a process of manufacturing semiconductor devices, plat panels such as liquid crystal displays, and so on, substrates such as semiconductor wafers (hereinafter referred to as wafers) and glass substrates, which are accommodated in a substrate transfer container, are loaded to a loading port of a semiconductor manufacturing apparatus, and take out of the substrate transfer container by a transfer arm in the semiconductor manufacturing apparatus to be transferred to a processing module of the semiconductor manufacturing apparatus.

A multi-chamber system is one example of the semiconductor manufacturing apparatus. The multi-chamber system has a first transfer chamber of an atmospheric pressure atmosphere which is connected to the loading port. In addition, the multi-chamber system has a second transfer chamber which is connected to a plurality of processing modules for performing an etching process and a deposition process by CVD (Chemical Vapor Deposition) and is under a vacuum atmosphere common to the plurality of processing modules. In addition, the multi-chamber system has a load-lock chamber which is interposed between the first transfer chamber and the second transfer chamber, switches between the vacuum atmosphere and the atmospheric pressure atmosphere and makes substrates stand by. In addition, in the multi-chamber system, multi-joint transfer arms configured to allow a wafer holder (pick) at a leading end to hold a backside of a wafer are respectively provided in the first transfer chamber and the second transfer chamber. In addition, in the multi-chamber system, the first transfer chamber is connected with an alignment chamber including an orientor for aligning the wafer. The orientor performs the aligning of the wafer such that a notch formed in an edge of the wafer faces a predetermined direction by rotating the wafer around a vertical axis through a pedestal (stage) holding the central portion of the backside of the wafer (see, e.g., Japanese Patent Laid-open Publication Nos. 2009-088222 and 2008-300609).

Here, there is a technique for performing temperature adjustment when the alignment is performed. There is also a gripping mechanism for gripping the circumference of the wafer by an opening/closing operation.

However, the above-described technique has a problem of inefficiency of alignment.

SUMMARY OF THE INVENTION

A substrate transfer method is according with an embodiment includes: a step of placing a first substrate and a second substrate on a first alignment part and a second alignment part which are arranged to be vertically spaced from each other, respectively, by using a first pick and a second pick for holding the first substrate and the second substrate to be vertically spaced from each other, respectively. The method further includes, a first positioning step of positioning the first pick at a first reception position determined based on an alignment position for the first substrate aligned by the first alignment part; a first receiving step of receiving the first substrate from the first alignment part by moving the first pick vertically; a second positioning step of positioning the second pick at a second reception position determined based on an alignment position for the second substrate aligned by the second alignment part; and a second receiving step of receiving the second substrate from the second alignment part by moving the second pick vertically.

Advantages of the Invention

One embodiment of the substrate transfer method has an advantage of efficient position adjustment.

DETAILED DESCRIPTION OF THE EMBODIMENTS

Hereinafter, embodiments of a substrate transfer method will be described in detail with reference to the accompanying drawings. However, the present invention is not limited to the disclosed embodiments. The disclosed embodiments may be used in proper combinations as long as they have no contradiction to each other.

(Transfer Device According to First Embodiment)

Figure 1:
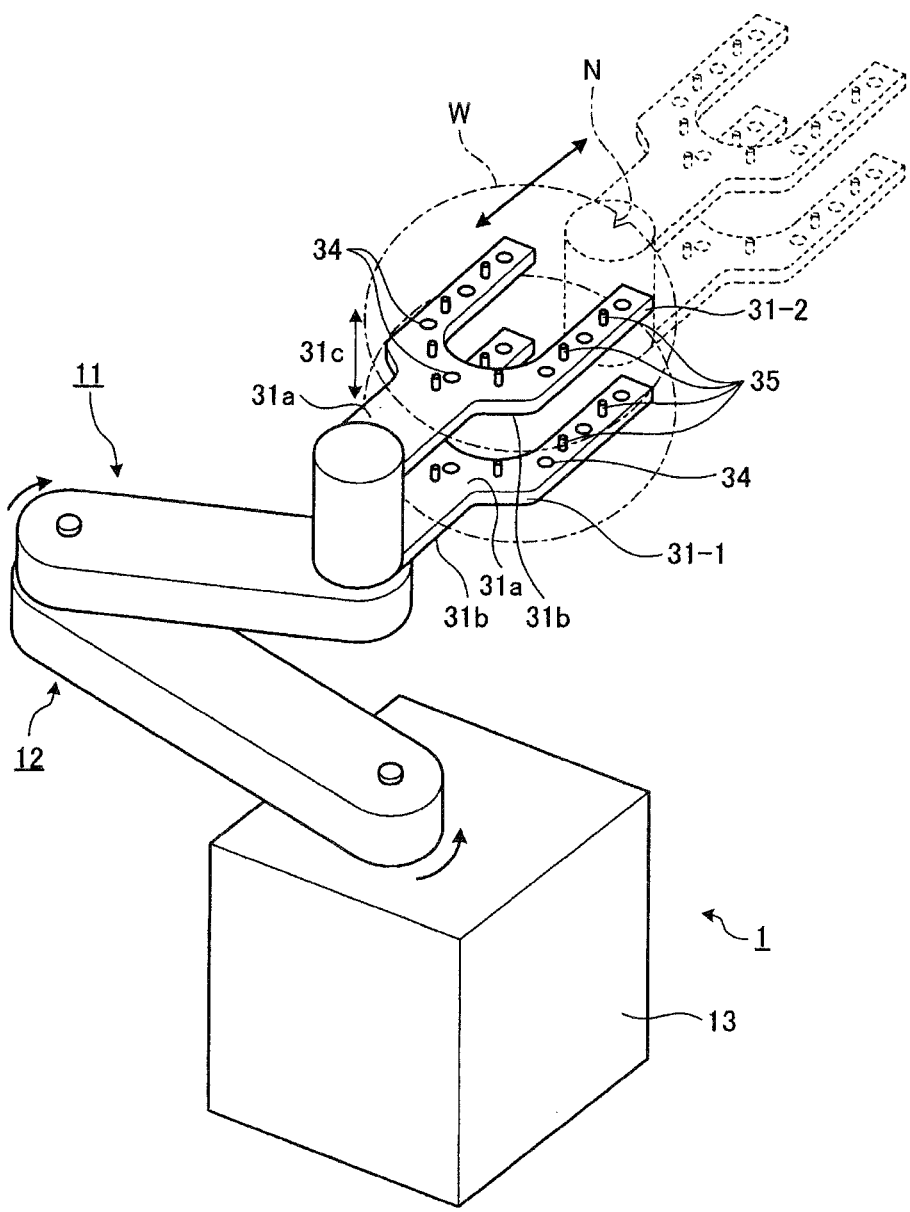
FIG. 1 is a perspective view illustrating one example of a transfer device according to a first embodiment.

FIG. 1 is a perspective view illustrating one example of a transfer device according to a first embodiment. The transfer device 1 attracts and holds substrates such as wafers W by means of a Bernoulli chuck using a Bernoulli Effect and transfers the wafers W. As illustrated in FIG. 1, the transfer device 1 includes a first pick 31-1 which holds a first wafer W-1 and a second pick 31-2 which is vertically spaced from the first pick 31-1 and holds a second wafer W-2, in which case a distance between the bottom surface of the first wafer W-1 held on the first pick 31-1 and the bottom surface of the second wafer W-2 held on the second pick 31-2 corresponds to a first distance 31c.

As will be described in detail later, a semiconductor manufacturing apparatus 8, in which the transfer device 1 includes a first pedestal 6-1 for determining an alignment position and a second pedestal 6-2 for determining an alignment position (see FIG. 9). Here, the first distance 31c is different from a second distance 6c which is a vertical distance between the bottom surface of the first wafer W-1 held on the first pedestal 6-1 and the bottom surface of the second wafer W-2 held on the second pedestal 6-2.

For example, the first distance 31c is narrower than the second distance 31c. More preferably, the first distance 31c corresponds to a vertical holding distance between the wafers W held in a substrate transfer container. The substrate transfer container is, for example, FOUP (Front Opening Unified Pod).

As illustrated in FIG. 1, the transfer device 1 further includes one arm unit. In the example shown in FIG. 1, the transfer device 1 includes a middle arm section 11 and a swiveling arm section 12. Base ends of the first pick 31-1 and the second pick 31-2 are rotatably connected to a leading end portion of the middle arm section 11 about a vertical axis and a base end portion of the middle arm section 11 is rotatably connected to a leading end portion of the swiveling arm section 12 about a vertical axis. The transfer device 1 is implemented with an articulated (SCARA) transfer arm which is well-known in the art. A base end portion of the swiveling arm section 12 is rotatably connected to a base 13 about a vertical axis.

Here, as illustrated in FIG. 1, each of the first pick 31-1 and the second pick 31-2 has a first surface 31a serving as a surface for holding a wafer W and a second surface 31b opposite to the first surface 31a. The first pick 31-1 and the second pick 31-2 are arranged in the arm unit so as to be vertically spaced from each other.

Figure 2:
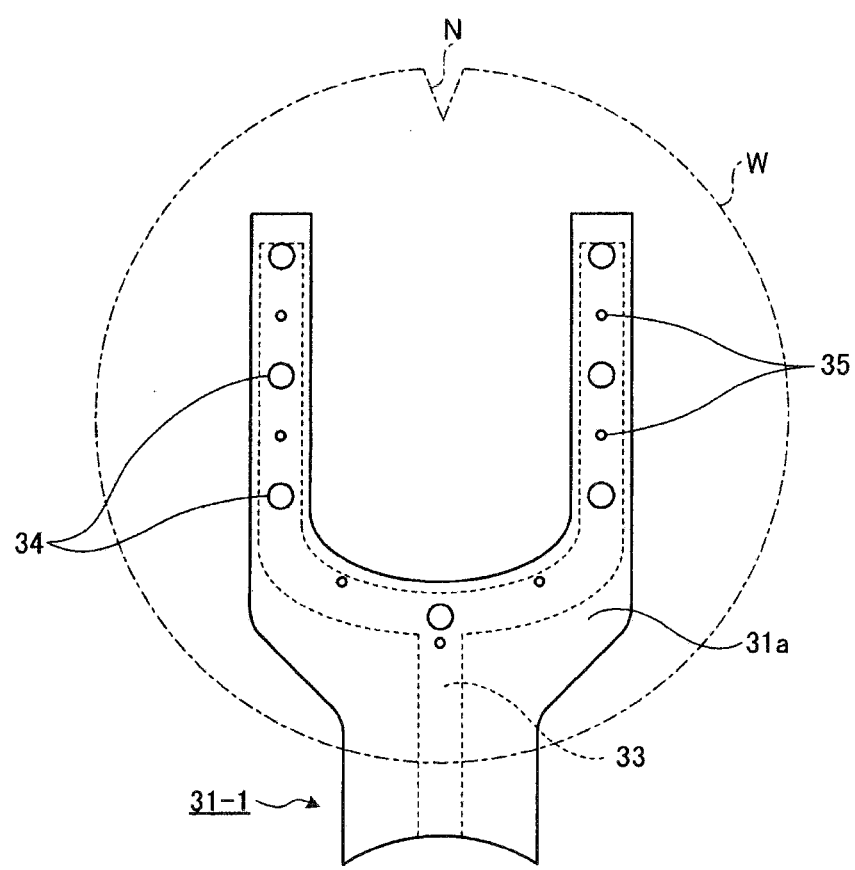
FIG. 2 is a top view illustrating one example of a first pick in the first embodiment.
Figure 3:
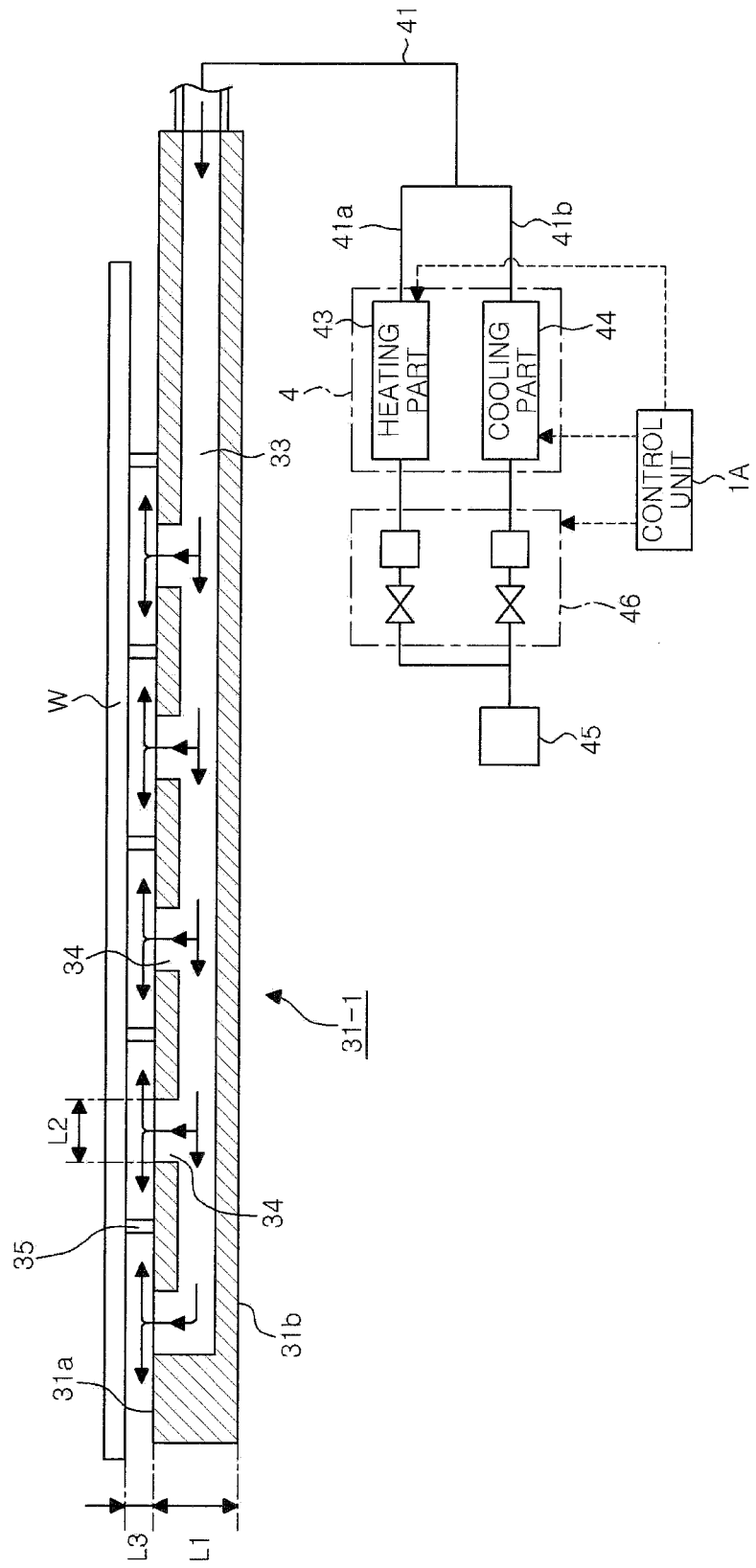
FIG. 3 is a longitudinal-sectional side view illustrating one example of the first pick in the first embodiment.

FIG. 2 is a top view illustrating one example of the first pick in the first embodiment. FIG. 3 is a longitudinal-sectional view illustrating one example of the first pick in the first embodiment. In the following description, the first pick 31-1 is described by way of one example but this description is equally applied to the second pick 31-2.

A heating part 43 and a cooling part 44 constitute a temperature adjusting unit 4. The heating part 43 is implemented with a heater installed in an air flow path. As power supplied to the heater is controlled by a control unit 1A, the temperature of air passing through an air supply pipe 41a is controlled. The cooling part 44 is configured as a secondary side passage of a heat exchanger. The quantity of heat exchange between the cooling part 44 and a coolant flowing through a primary side passage of the heat exchanger is controlled by adjustment of a flow rate of the coolant by the control unit 1A, thereby controlling the temperature of gas flowing through an air supply pipe 41b. The control unit 1A controls a flow rate controller 46 to control flow rates of air flowing through the air supply pipes 41a and 41b.

The first pick 31-1 has a shape of fork with its distal side bifurcated and is made of, for example, ceramic or aluminum. The first pick 31-1 is configured as a Bernoulli chuck. In FIG. 3, its thickness denoted by L1 is, for example, 2 mm to 4 mm. The first pick 31-1 has therein an air flow path 33 extending from the proximal side to distal side of the first pick 31-1. A plurality of air discharge holes 34 communicating to the flow path 33 is formed in the first surface 31a of the first pick 31-1. A proximal side of the flow path 33 is connected to the air supply pipe 41 and accordingly, air heated in the heating part 43 or air cooled in the cooling part 44 is discharged from the discharge holes 34. In the example shown in FIG. 3, the diameter of each discharge hole 34 is 5 mm to 20 mm.

A plurality of bar-like pads 35 as convex portions is formed on the top surface of the first pick 31-1, and the backside (bottom surface) of the wafer W is placed on the pads 35. The pads 35 are made of material having a strong frictional force against the backside of the wafer W in order to prevent the wafer W from sliding on and falling from the pads 35 when the first pick 31-1 is forward/backward moved and is rotated about the vertical axis. If the backside of the wafer W is made of silicon, the pads 35 are preferably made of, for example, rubber, resin, ceramic or the like. In FIG. 3, the height of the pads 35, denoted by L3, is 0.5 mm to 2 mm.

In this embodiment, the transfer device 1 includes the control unit 1A including, for example, a computer. The control unit 1A includes a data processing part constituted by a program, a memory and a CPU. The program is configured to cause the control unit 1A to send control signals to various components of the transfer device 1 and perform a variety of steps (which will be described in detail later) to transfer the wafer W. The memory includes regions where values of various process parameters are written. When the CPU executes instructions of the program, the process parameters are read and control signals based on the parameter values are sent to various components of the transfer device 1. The program (including a program related to input manipulation and display of the process parameters) is stored in a storage device such as, for example, a flexible disc, a compact disc, MO (Magneto-Optical disc) or the like and is installed in the control unit 1A.

(Semiconductor Manufacturing Apparatus in First Embodiment)

One example of a semiconductor manufacturing apparatus including the transfer device according to the first embodiment will be described below. In more detail, exchange of the wafer W between the transfer device 1 and an orientor for aligning the wafer W in the semiconductor manufacturing apparatus will be described.

Figure 4:
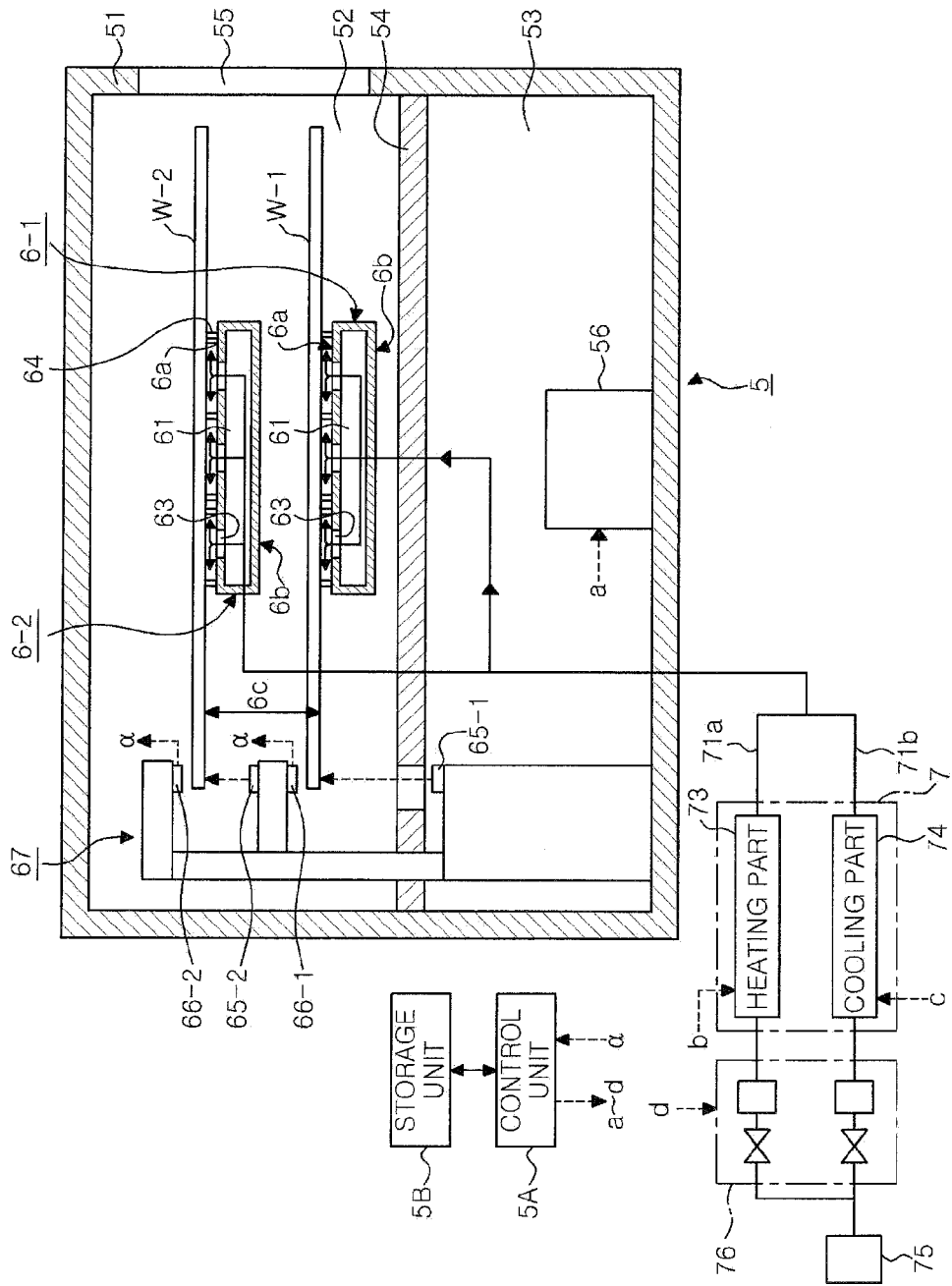
FIG. 4 is a longitudinal-sectional side view illustrating one example of an orientor in the first embodiment.
Figure 5:
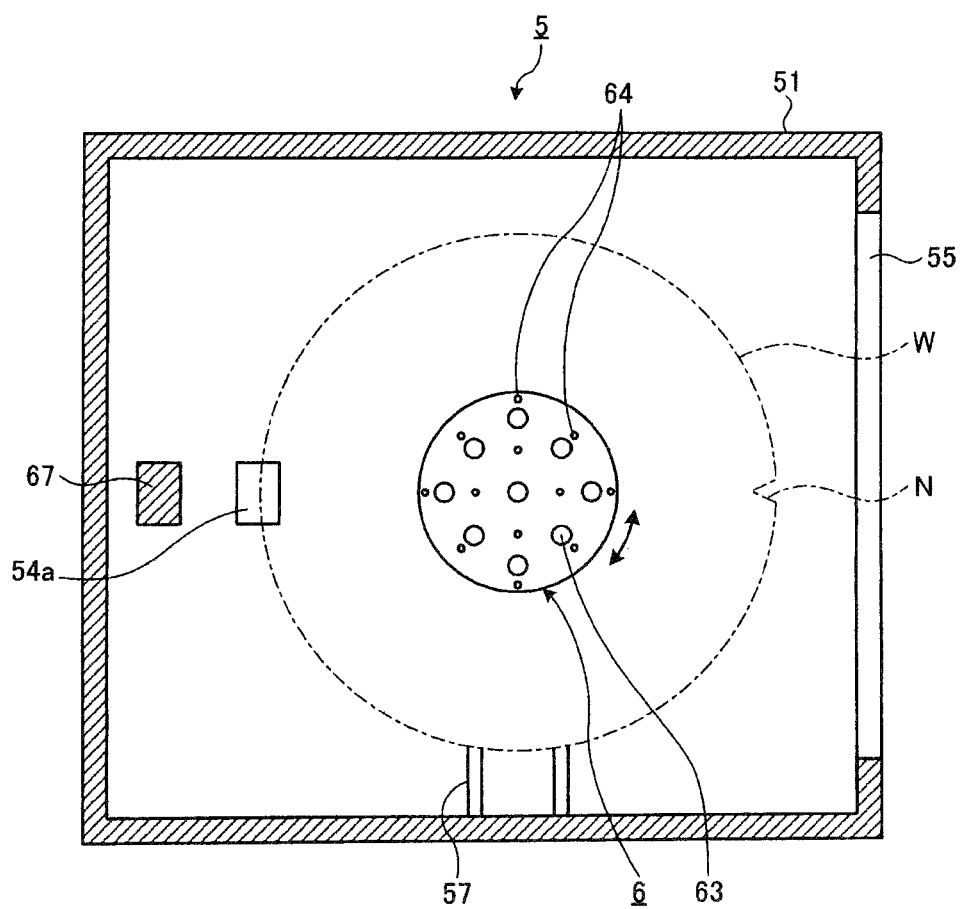
FIG. 5 is a cross-sectional plan view illustrating one example of the orientor in the first embodiment.

FIG. 4 is a longitudinal-sectional view illustrating one example of an orientor in the first embodiment. FIG. 5 is a plan view illustrating one example of the orientor in the first embodiment. The orientor 5 includes a housing 51 and a partitioning plate 54 partitioning the housing 51 into an upper chamber 52 and a lower chamber 53. A transfer port 55 for loading/unloading the wafer W is formed in a side wall of the housing 51. The inside of the housing 51 is in an atmospheric pressure atmosphere.

Circular first and second pedestals 6-1 and 6-2 configured as Bernoulli chucks are horizontally provided in the upper chamber 52. The first pedestal 6-1 is used to hold the first wafer W-1 held on the first pick 31-1 and determine its alignment position. The second pedestal 6-2 is used to determine an alignment position of the second wafer W-2.

In this embodiment, each of the first pedestal 6-1 and the second pedestal 6-2 has a third surface 6a serving as a surface for holding a wafer W and a fourth surface 6b opposite to the third surface 6a. The first pedestal 6-1 and the second pedestal 6-2 are arranged to be vertically spaced from each other, as described above. In this embodiment, as described above, the first distance 31c is different from the second distance 6c. Preferably, the first distance 31c is narrower than the second distance 6c. The first pedestal 6-1 and the second pedestal 6-2 are also referred to as a first alignment part and a second alignment part, respectively.

The first pedestal 6-1 and the second pedestal 6-2 are connected to a rotation driving mechanism 56 provided in the lower chamber 53 through a shaft 57 and are configured to be rotated about a vertical axis.

An air passage 61 is formed in each of the first pedestal 6-1 and the second pedestal 6-2 and communicates with a plurality of air discharge holes 63 formed in the third surface 6a of each of the first pedestal 6-1 and the second pedestal 6-2. Pads 64 configured in the same manner as the above-mentioned pads 35 are formed on the top surface of each of the first pedestal 6-1 and the second pedestal 6-2. When the central portion of the backside of the wafer W is mounted on the pads 64 under a state where air is discharged from the discharge holes 63, a downward force exerts on the wafer W by the Bernoulli effect so that the wafer W can be pressed against the pads 64 and horizontally held.

One end of an air supply pipe 71 is opened and connected to the passage 61 of each of the first pedestal 6-1 and the second pedestal 6-2. The air supply pipe 71 is extended through a pipeline 58 formed in the shaft 57 and the other end of the air supply pipe 71 branches into two air supply pipes 71a and 71b. An end of the air supply pipe 71a is connected to an air source 75 via a heating part 73 and a flow rate controller 76 and an end of the air supply pipe 71b is connected to the air source 75 via a cooling part 74 and the flow rate controller 76. The heating part 73, the cooling part 74, the air source 75 and the flow rate controller 76 are configured in the same manner as the heating part 43, the cooling part 44, the air source 45 and the flow rate controller 46, respectively, and a temperature adjusting unit 7 is constituted by the heating part 73 and the cooling part 74.

In the first embodiment, the first pedestal 6-1 and the second pedestal 6-2 are vertically arranged to have the second distance 6c, as shown in FIG. 4. As a result, as shown in FIG. 5, the shaft 57 extends horizontally from the first pedestal 6-1 and the second pedestal 6-2, and then extends along a wall of the orientor 5 to the rotation driving mechanism 56. The rotation driving mechanism 56 is configured to rotate the first pedestal 6-1 and the second pedestal 6-2 about the vertical axis by means of a motor (not shown).

A detecting mechanism 67 for detecting the position of the periphery of the wafer W mounted on each of the first pedestal 6-1 and the second pedestal 6-2 is provided in the housing 51. The detecting mechanism 67 includes a light emitting part 65 such as a LED provided in the lower chamber and a light receiving part 66 such as a CCD sensor provided in the upper chamber 52. Light emitted from the light emitting part 65 is incident into the light receiving part 66 through a hole 54a formed in the partitioning plate and the light receiving part 66 outputs a signal corresponding to the amount of incident light to the control unit 5A.

In the example shown in FIG. 4, the detecting mechanism 67 is provided for each of the two pedestals. More specifically, a light emitting part 65-1 and a light receiving part 66-1 are provided as a detecting mechanism for the first pedestal 6-1 and a light emitting part 65-2 and a light receiving part 66-2 are provided as a detecting mechanism for the second pedestal 6-2.

The control unit 5A is configured in the same manner as the control unit 1A and executes a program stored in a storage unit 5B to control operations of various components of the orientor 5 and control position adjustment of the wafer W (as will be described later) and a flow rate of air discharged from the first pedestal 6-1 and the second pedestal 6-2. Exchange of the wafer W between the transfer device 1 and the first and second pedestals 6-1 and 6-2 will be described in detail later.

In this embodiment, in the orientor 5, the position adjustment is performed for each of the wafers W held on the first pedestal 6-1 and the second pedestal 6-2. More specifically, the control unit 5A rotates the wafer W about the vertical axis through the pedestal holding the central portion of the backside of the wafer W and performs the position adjustment of the wafer W such that a notch formed in the periphery of the wafer W faces a predetermined direction. In addition, the control unit 5A determines the center position of the wafer W. As a result, when the wafer W is unloaded from the orientor 5, after the position adjustment of the wafer W performed such that the notch faces the predetermined direction, the wafers W held on the first pedestal 6-1 and the second pedestal 6-2 are respectively taken by the first pick 31-1 and the second pick 31-2 to be unload from the orientor 5 at the center position (alignment position) determined in the orientor 5. A flow of a process of unloading the wafers W from the orientor 5 is not described here but will be described in detail later.

Figure 6:
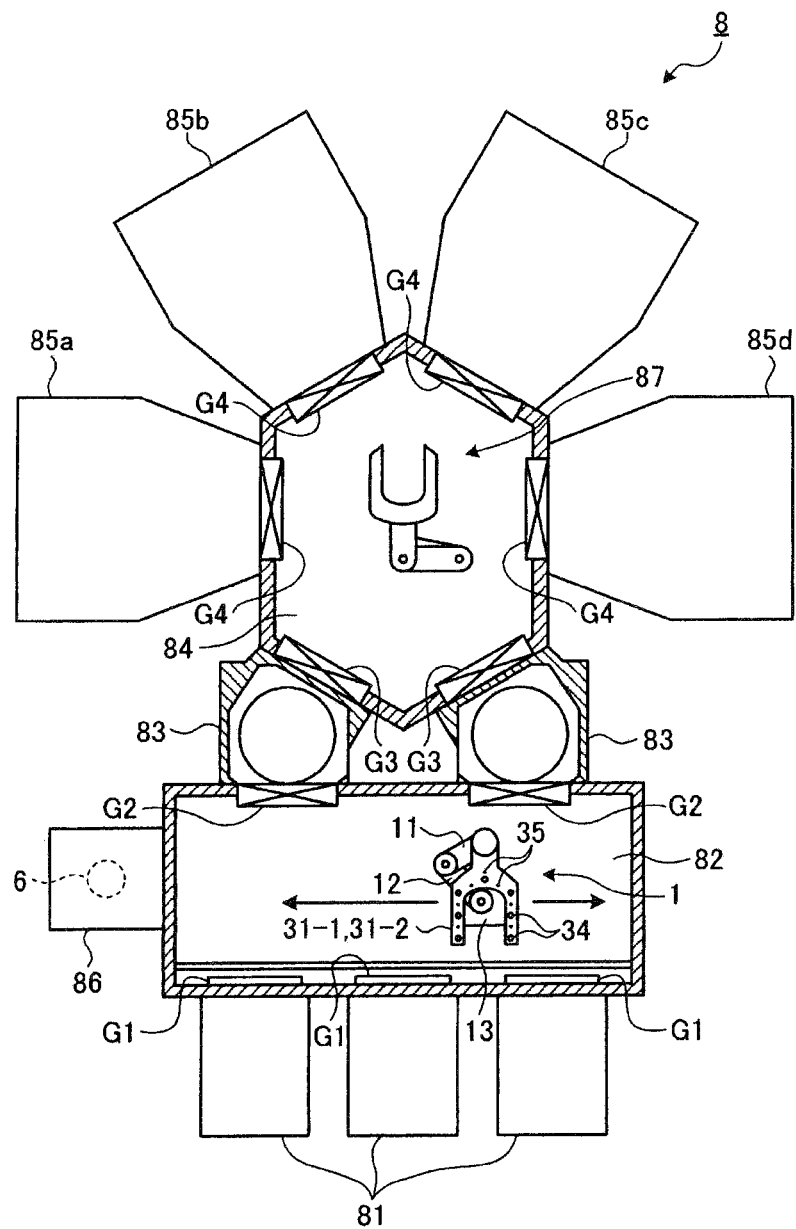
FIG. 6 is a plan view illustrating one example of a semiconductor manufacturing apparatus in the first embodiment.
Figure 7:
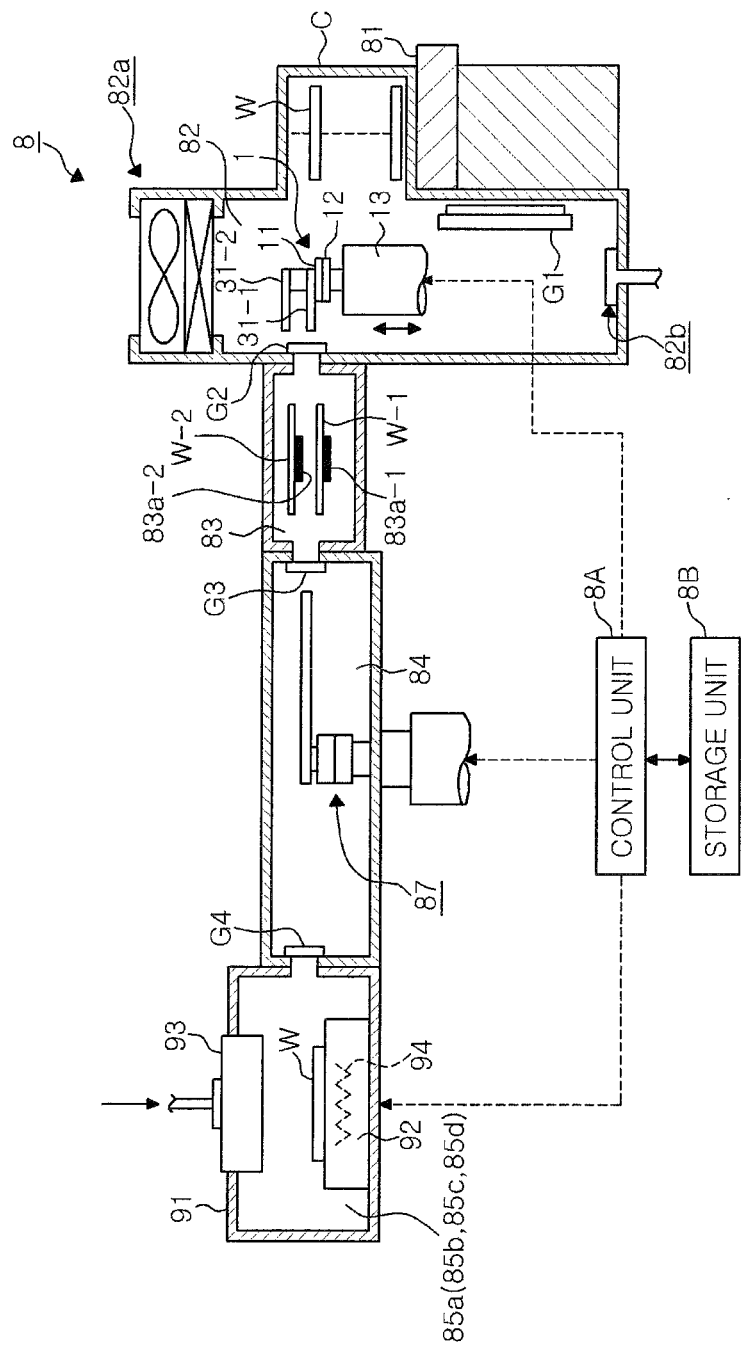
FIG. 7 is a longitudinal-sectional side view illustrating one example of the semiconductor manufacturing apparatus in the first embodiment.

FIG. 6 is a plan view illustrating one example of the semiconductor manufacturing apparatus in the first embodiment. FIG. 7 is a longitudinal-sectional view illustrating one example of the semiconductor manufacturing apparatus in the first embodiment. The semiconductor manufacturing apparatus illustrated in FIGS. 6 and 7 is also referred to as a multi-chamber system.

In the example shown in FIG. 6, the semiconductor manufacturing apparatus 8 includes three carrier mounting stages 81 on which a substrate transfer container C storing a predetermined number of wafers W to be processed is mounted. The semiconductor manufacturing apparatus 8 further includes a first transfer chamber 82 into which the wafers W are transferred under the atmospheric pressure atmosphere. The semiconductor manufacturing apparatus 8 further includes two horizontally-arranged load-lock chambers 83 for switching between the atmospheric pressure atmosphere and a vacuum atmosphere and making the wafers W stand by. The semiconductor manufacturing apparatus 8 further includes a second transfer chamber 84 into which the wafers W are transferred under the vacuum atmosphere, and four processing modules 85a to 85d in which loaded wafers W are subjected to a process. The substrate transfer container is also referred to as a "carrier".

These units are arranged in the loading direction of the wafers W in the order of the first transfer chamber 82, the load-lock chamber 83, the second transfer chamber 84 and the processing modules 85a to 85d and adjacent units are air-tightly connected to each other through a door G1 or gate valves G2 to G4. In the following description, a direction in which the first transfer chamber 82 is present is assumed as a front side.

As illustrated in FIG. 7, the substrate transfer container C mounted on the carrier mounting stage 81 is connected to the first transfer chamber 82 through the door G1. The door G1 serves to open/close a lid of the substrate transfer container C. A fan/filter unit 82*a* including a fan for feeding air into the chamber and a filter for cleaning the air is provided on the ceiling of the first transfer chamber 82, and an exhaust unit 82*b* is provided on the bottom of the first transfer chamber 82. Accordingly, downdraft of clean air is formed in the first transfer chamber 82.

The above-described transfer device 1 is installed in the first transfer chamber 82. The transfer device 1 is configured such that the base 13 can be moved up/down and along the longitudinal direction of the first transfer chamber 82 by means of a driving mechanism (not shown) and is also configured to exchange the wafers W between an alignment chamber 86 and the substrate transfer container C, as will be described later. The alignment chamber 86 including the orientor 5 is provided at the side of the first transfer chamber 82.

Each of the two left and right load-lock chambers 83 includes a mounting table 83*a*-1 and a mounting table 83*a*-2 on which loaded wafers W are mounted. Each load-lock chamber 83 is connected to a vacuum pump (not shown) and a leak valve (not shown) for switching the load-lock chamber between the atmospheric pressure atmosphere and the vacuum atmosphere.

The second transfer chamber 84 has a hexagonal shape when seen from the top, with two front sides connected respectively to the load-lock chambers 83 and the four remaining sides connected respectively to the processing modules 85*a* to 85*d*, as illustrated in FIG. 6. A second transfer device 87 which can be rotated and expanded/contracted for transferring the wafers W between the load-lock chambers 83 and the processing modules 85*a* to 85*d* under the vacuum atmosphere is installed in the second transfer chamber 84. In addition, the second transfer chamber 84 is connected to a vacuum pump (not shown) for maintaining the second transfer chamber 84 at the vacuum atmosphere.

The processing modules 85*a* to 85*d* are connected to a vacuum pump (not shown) and are configured to perform processes under the vacuum atmosphere, for example, an etching process using an etching gas, a deposition process using a deposition gas, such as CVD, an ashing process using an ashing gas, and so on. Each of the processing modules 85*a* to 85*d* includes a processing chamber 91, a mounting table 92 on which a wafer W is mounted, and a gas shower head 93 for supplying a process gas into the processing chamber 91. In addition, a heater 94 for heating the mounted wafer W to a predetermined temperature when the wafer W is processed is provided in the mounting table 92.

Contents of the processes performed in the processing modules 85*a* to 85*d* may or not be the same. The transfer devices 1 and 87, the processing modules 85*a* to 85*d* and so on are connected to a control unit 8A for controlling the overall operation of the semiconductor manufacturing apparatus 8. The control unit 8A has the same configuration as the control unit 1A and is configured to execute a program which is stored in a storage unit 8B and is organized with a group of steps to carry out the operation of the semiconductor manufacturing apparatus 8 as described later.

Subsequently, a transfer path of a wafer W in the semiconductor manufacturing apparatus 8 will be described. A wafer W stored in the substrate transfer container C on the carrier mounting stage 81 is taken out of the substrate transfer container C by the transfer device 1 and is heated to a predetermined temperature, for example, 40° C., while being transferred into the first transfer chamber 82 and then the alignment chamber 86. The wafer W transferred into the alignment chamber 86 is positioned to allow its notch N to face a predetermined direction and is then adjusted to the predetermined temperature by the first pedestal 6-1 and the second pedestal 6-2. After being positioned, the wafer W is delivered to and stands by in one of the left and right load-lock chambers 83 by the transfer device 1.

Thereafter, when the load-lock chamber 83 is switched to enter the vacuum atmosphere, the wafer W is taken out of the load-lock chamber 83 and is transferred into the second transfer chamber 84 and then one of the processing modules 85*a* to 85*d* by the second transfer device 87. Then, the wafer W is mounted on the mounting table 92 of the corresponding processing module 85*a* to 85*d*, heated to a predetermined temperature and then subjected to a predetermined process. If different processes are sequentially performed in different processing modules 85*a* to 85*d*, the wafer W is transferred among the processing modules 85*a* to 85*d* required for the processes while reciprocating between the second transfer chamber 84 and the processing modules 85*a* to 85*d*.

The wafer W subjected to a required process in the processing module 85*a* to 85*d* is delivered to and stands by in one of the left and right load-lock chambers 83 by the second transfer device 87. Then, when the load-lock chamber 83 is switched to the vacuum atmosphere and the wafer W is cooled to a predetermined temperature, the transfer device 1 transfers the wafer W into the substrate transfer container C again and the wafer W is cooled to a predetermined temperature, for example, 60° C. during the transfer.

Although it has been shown in the example of FIG. 7 that each load-lock chamber 83 has two mounting tables 83*a*-1 and 83*a*-2, the second transfer device 87 provided in the second transfer chamber 84 transfers one wafer W, and each processing module 85*a* to 85*d* has one mounting table 92, the present invention is not limited thereto. For example, each load-lock chamber 83 may have one mounting table 83*a*-1, the second transfer device 87 provided in the second transfer chamber 84 may transfer two wafers W at the same time, and one or more of the processing modules 85*a* to 85*d* may have two mounting tables 92, or a combination thereof may be used.

(First Distance and Second Distance)

Figure 8:
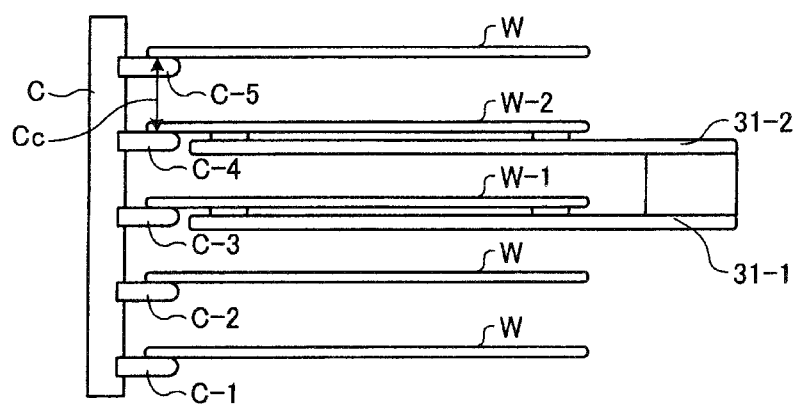
FIG. 8 is a view illustrating one example of a relationship between a substrate holding distance and a first distance in a substrate transfer container in the first embodiment.

FIG. 8 is a view illustrating one example of a relationship between a substrate holding distance in the substrate transfer container and the first distance in the first embodiment. Although it is shown in the example of FIG. 8 that the substrate transfer container C has holders C-1 to C-5 for holding wafers W, the number of holders is not limited to 5 but may be optional.

As illustrated in FIG. 8, a distance Cc between the top surfaces of adjacent holders in the substrate transfer container C is preferably equal to the first distance 31*c*. As a result, it is possible to quickly receive a plurality of wafers W from the substrate transfer container C. However, without being limited thereto, the distance Cc between the top surfaces of adjacent holders may be different from the first distance 31*c*.

Figure 9:
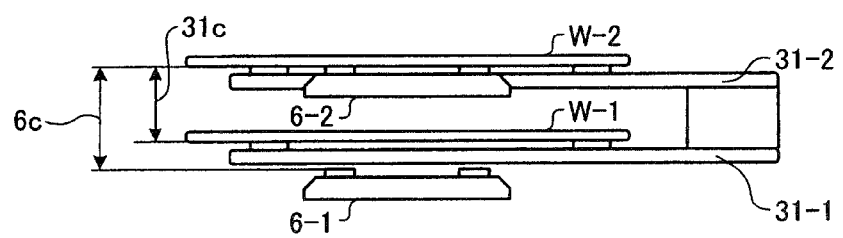
FIG. 9 is a view illustrating one example of a relationship between the first distance and a second distance in the first embodiment.

FIG. 9 is a view illustrating one example of a relationship between the first distance and the second distance in the first embodiment. For convenience of description, the first pedestal 6-1, the second pedestal 6-2, the first pick 31-1 and the second pick 31-2 are shown in the example of FIG. 9. As illustrated in FIG. 9, the first distance 31c is preferably smaller than the second distance 6c.

(Flow of Delivering Wafers from Substrate Transfer Container to First Pick and Second Pick)

Figure 10:
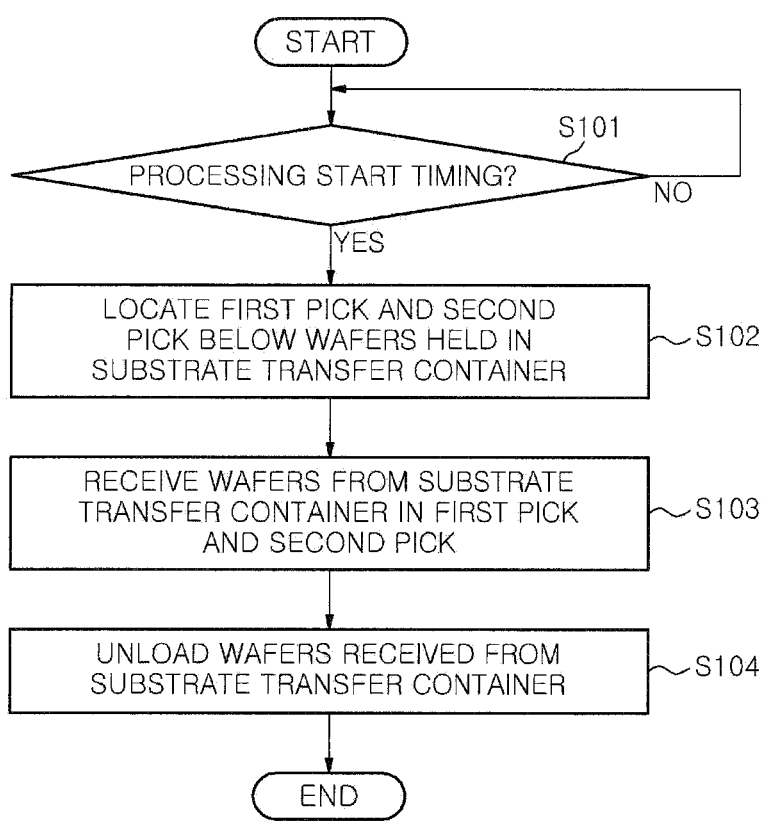
FIG. 10 is a flow chart illustrating one example of a flow of delivering wafers from a substrate transfer container to a first pick and a second pick in the first embodiment.
Figure 11A:
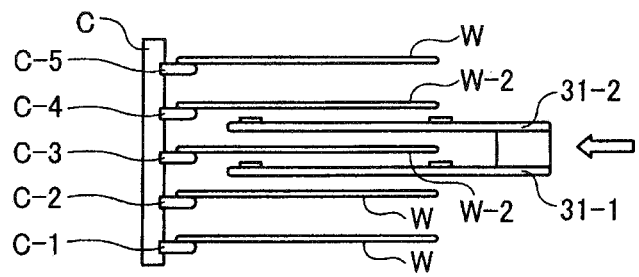
FIGS. 11A to 11E are views for explaining one example of a flow of delivering wafers from the substrate transfer container to the first pick and the second pick.

FIG. 10 is a flow chart illustrating one example of a flow of delivering wafers from the substrate transfer container to the first pick and the second pick in the first embodiment. FIGS. 11A to 11S are views for explaining one example of a flow of delivering wafers from the substrate transfer container to the first pick and the second pick.

Figure 11B:
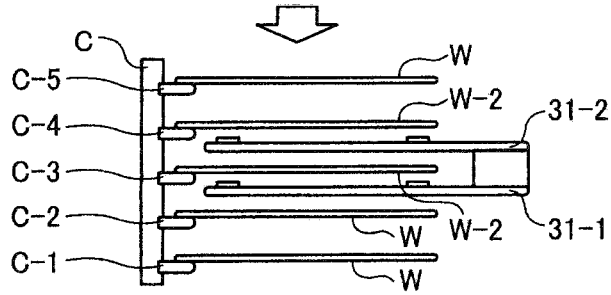

As illustrated in FIG. 10, at a processing start timing (Yes in Step S101), the transfer device 1 actuates the arm unit to locate the first pick 31-1 and the second pick 31-2 below wafers W held in the substrate transfer container C (Step S102). That is, the transfer device 1 puts the first pick 31-1 and the second pick 31-2 into the substrate transfer container C, as illustrated in FIG. 11A, and locates the first pick 31-1 and the second pick 31-2 below wafers W held in the substrate transfer container C, as illustrated in FIG. 11B.

Figure 11C:
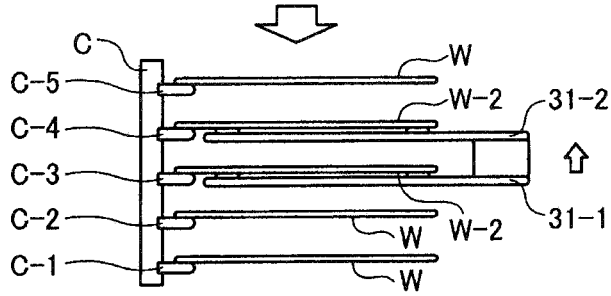

Then, the transfer device 1 receives the wafers W from the substrate transfer container C by the first pick 31-1 and the second pick 31-2 (Step S103). That is, the transfer device 1 actuates the arm unit to vertically ascend the first pick 31-1 and the second pick 31-2 until the picks contact the bottom surfaces of the wafers W, as illustrated in FIG. 11C.

Figure 11D:
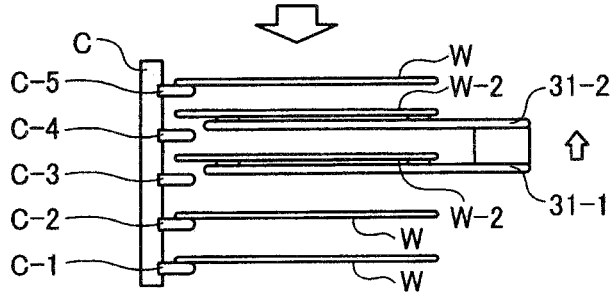
Figure 11E:
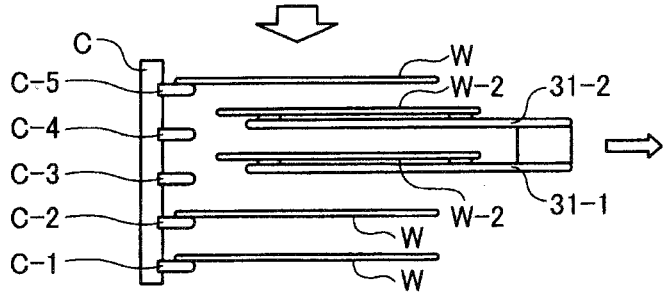

Then, as illustrated in FIG. 11D, the transfer device 1 moves the wafers W up to a height at which the wafers W are unloaded from the substrate transfer container C by further ascending the first pick 31-1 and the second pick 31-2 vertically, and unloads the wafers W received by the first pick 31-1 and the second pick 31-2 from the substrate transfer container C (Step S104). That is, as illustrated in FIG. 11E, the wafers W are unloaded from the substrate transfer container C by retreating the first pick 31-1 and the second pick 31-2 from the substrate transfer container C.

(Delivery of wafer Between Orientor and Transfer Device)

As will be described in detail below, the transfer device 1 mounts the first wafer W-1 held on the first pick 31-1 and the second wafer W-2 held on the second pick 31-2 on the first pedestal 6-1 and the second pedestal 6-2, respectively. Then, the transfer device 1 locates the first pick 31-1 at a first reception position determined based on an alignment position determined by the first pedestal 6-1 and receives the first wafer W-1 from the first pedestal 6-1 by moving the first pick 31-1 upward. Thereafter, the transfer device 1 locates the second pick 31-2 at a second reception position determined based on an alignment position determined by the second pedestal 6-2 and receives the second wafer W-2 from the second pedestal 6-2 by moving the second pick 31-2 upward.

Hereinafter, a flow of process of loading the wafers W onto the first pedestal 6-1 and the second pedestal 6-2 of the orientor 5 and a flow of process of unloading the wafers W from the orientor 5 will be described in detail.

(Flow of Loading of Wafer W into Orientor)

Figure 12:
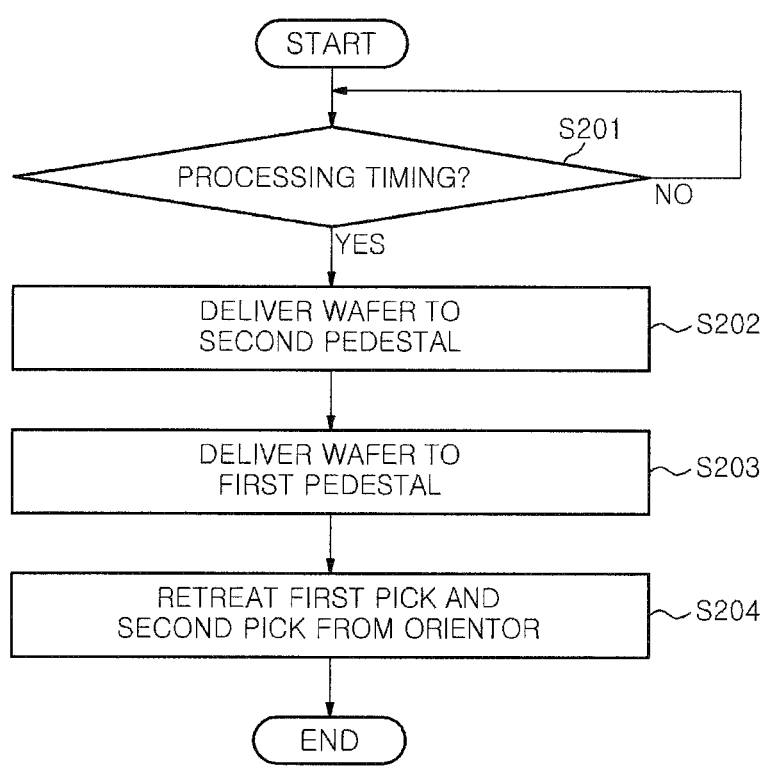
FIG. 12 is a flow chart illustrating one example of a flow of loading wafers into the orientor in the first embodiment.

FIG. 12 is a flow chart illustrating one example of a flow of loading of wafers W into the orientor in the first embodiment. FIGS. 13A to 13F are views illustrating one example of a flow of loading of wafers into the orientor in the first embodiment.

Figure 13A:
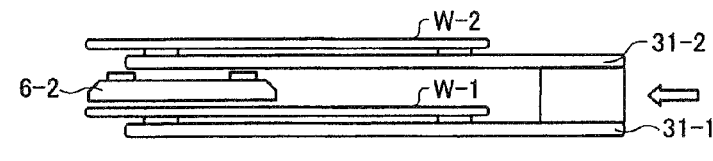
FIGS. 13A to 13F are views illustrating one example of a flow of loading wafers into the orientor in the first embodiment.

As illustrated in FIG. 12, at a process timing (Yes in Step S201), the transfer device 1 actuates the arm unit to put the first pick 31-1 and the second pick 31-2 holding the wafers W into the orientor 5. That is, the transfer device 1 moves the first pick 31-1 and the second pick 31-2 into the orientor 5, as illustrated in FIG. 13A.

Figure 13B:
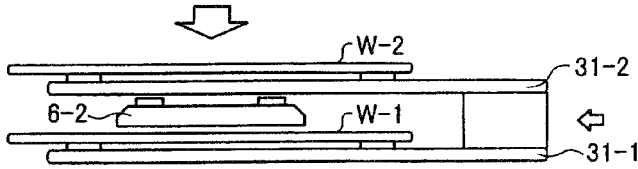
Figure 13C:
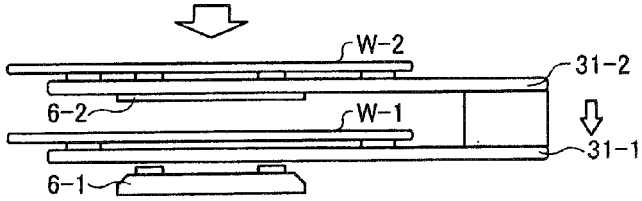

Then, the transfer device 1 delivers the wafer W-2 to the second pedestal 6-2 (Step S202). For example, as illustrated in FIG. 13B, the first pick 31-1 and the second pick 31-2 are moved such that a position on the horizontal plane of the second pick 31-2 corresponds to a position at which the wafer W is delivered to the second pedestal 6-2, and as illustrated in FIG. 13C, the wafer W-2 is delivered to the second pedestal 6-2 by descending the first pick 31-1 and the second pick 31-2 vertically.

Figure 13D:
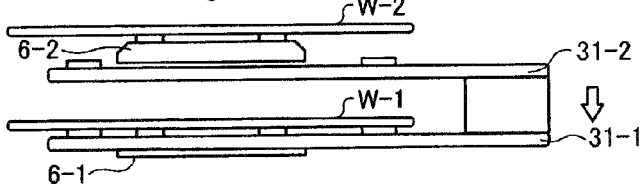

Then, the transfer device 1 delivers the wafer W-1 to the first pedestal 6-1 (Step S203). For example, as illustrated in FIG. 13D, the wafer W-1 is delivered to the first pedestal 6-1 by further descending the first pick 31-1 and the second pick 31-2 vertically.

Figure 13E:
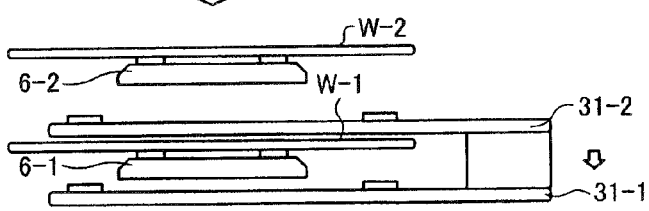
Figure 13F:
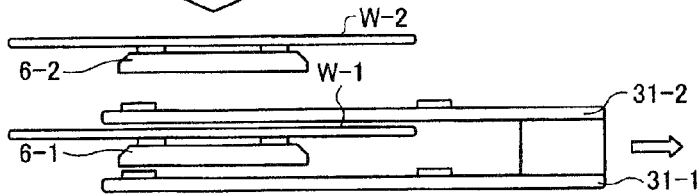

Then, the transfer device 1 retreats the first pick 31-1 and the second pick 31-2 from the orientor 5 (Step S204). That is, the transfer device 1 moves the first pick 31-1 and the second pick 31-2 up to a height at which the first pick 31-1 and the second pick 31-2 are retreated by further descending the first pick 31-1 and the second pick 31-2, as illustrated in FIG. 13E, and retreats the first pick 31-1 and the second pick 31-2 from the orientor 5, as illustrated in FIG. 13F.

(Flow of Unloading of Wafer W from Orientor)

Figure 14:
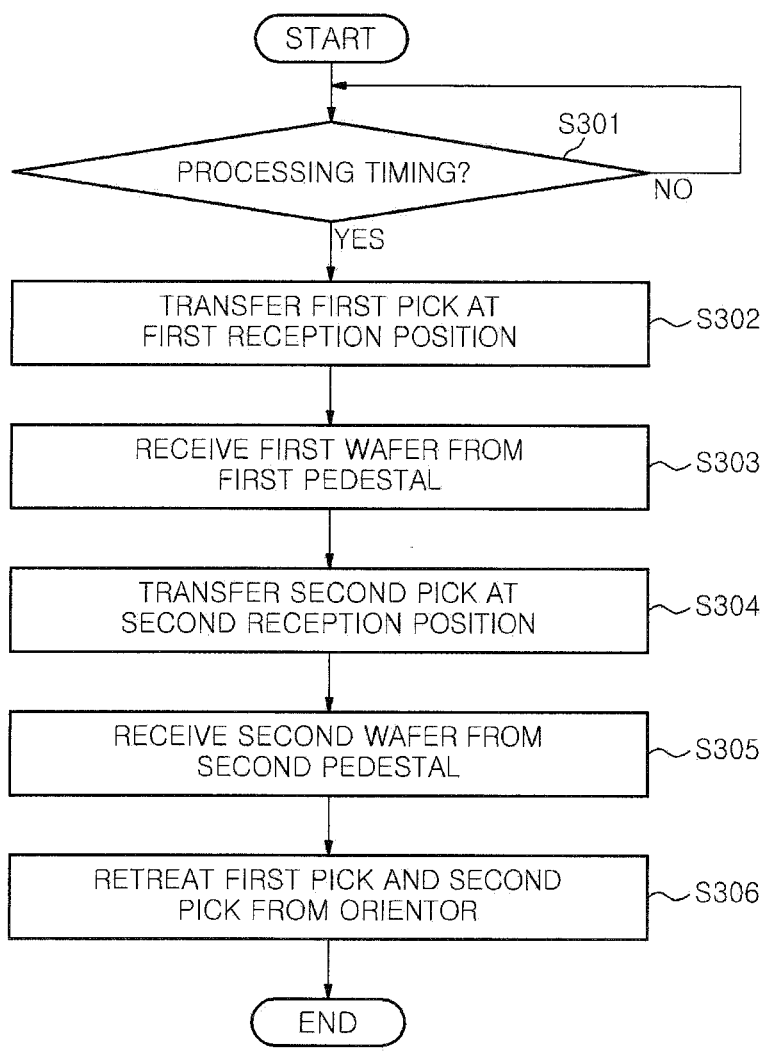
FIG. 14 is a flow chart illustrating one example of a flow of unloading wafers from the orientor in the first embodiment.

FIG. 14 is a flow chart illustrating one example of a flow of unloading of wafers from the orientor in the first embodiment. FIGS. 15A to 15I are views illustrating one example of a flow of unloading of wafers from the orientor in the first embodiment.

Figure 15A:
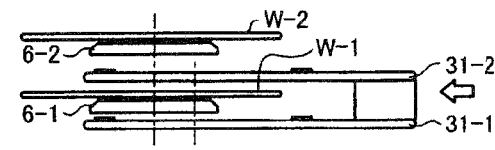
FIGS. 15A to 15I are views illustrating one example of a flow of unloading wafers from the orientor in the first embodiment.
Figure 15B:
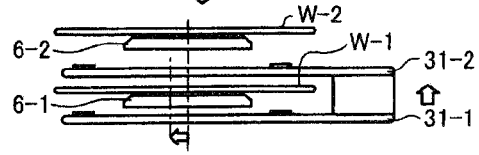

As illustrated FIG. 14, at a process timing (Yes in Step S301), the transfer device 1 locates the first pick 31-1 at a first reception position determined based on an alignment position determined by the first pedestal 6-1 (Step S302). For example, the transfer device 1 moves the first pick 31-1 and the second pick 31-2 such that the first pick 31-1 is located at the first reception position determined based on the alignment position determined by the first pedestal 6-1. That is, the transfer device 1 moves the first pick 31-1 into the orientor 5, as illustrated in FIG. 15A, and moves the first pick 31-1 and the second pick 31-2 such that the first pick 31-1 is located at the first reception position corresponding to a position at which the wafer W-1 can be received by the first pick 31-1 in the alignment position of the wafers W, as illustrated in FIG. 15B. As a result, a distance by which the transfer device 1 moves the first pick 31-1 and the second pick 31-2 vertically is not necessarily equal to a distance when the wafers W are loaded into the orientor 5.

Figure 15C:
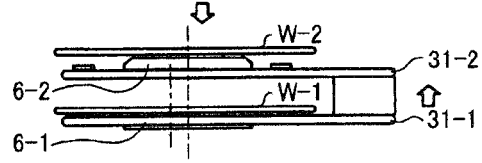
Figure 15D:
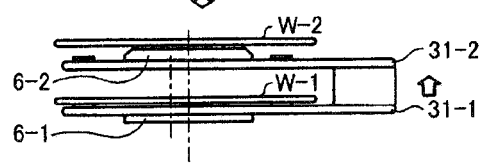

Then, the transfer device 1 receives the first wafer W-1 from the first pedestal 6-1 by moving the first pick 31-1 upward (Step S303). For example, by moving the first pick 31-1 and the second pick 31-2 in the vertical direction from the first pedestal 6-1 toward the second pedestal 6-2, the transfer device 1 receives the first wafer W-1 held on the first pedestal 6-1 in the first pick 31-1. That is, as illustrated in FIG. 15C, by ascending the first pick 31-1 and the second pick 31-2 vertically, the transfer device 1 receives the wafer W-1 by the first pick 31-1, as illustrated in FIG. 15D.

Figure 15E:
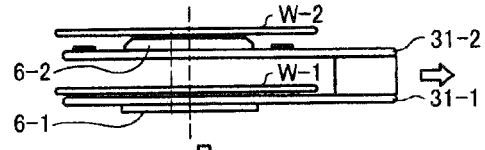
Figure 15F:
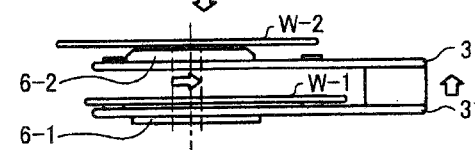

Then, the transfer device 1 locates the second pick 31-2 at the second reception position determined based on the alignment position determined by the second pedestal 6-2 (Step S304). For example, the transfer device 1 moves the first pick 31-1 and the second pick 31-2 such that the second pick 31-2 is located at the second reception position determined based on the alignment position determined by the second pedestal 6-2. That is, as illustrated in FIG. 15E, by moving the first pick 31-1 and the second pick 31-2 horizontally, the transfer device 1 locates the second pick 31-2 at the second reception position corresponding to a position at which the wafer W-2 can be received by the second pick 31-2 in the alignment position of the wafers W, as illustrated in FIG. 15F.

Figure 15G:
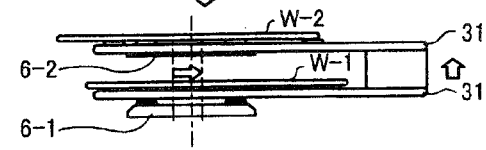
Figure 15H:
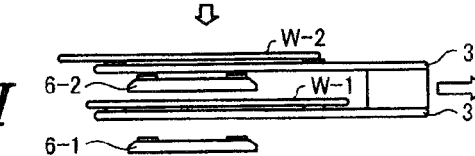

Then, by moving the second pick 31-2 upward, the transfer device 1 receives the second wafer W-2 from the second pedestal 6-2 (Step S305). For example, by moving the first pick 31-1 and the second pick 31-2 in the vertical direction from the first pedestal 6-1 toward the second pedestal 6-2, the transfer device 1 receives the second wafer W-2 held on the second pedestal 6-2 by the second pick 31-2. That is, as illustrated in FIG. 15G, by ascending the first pick 31-1 and the second pick 31-2 vertically, the transfer device 1 receives the wafer W-2 by the second pick 31-2, as illustrated in FIG. 15H.

Figure 15I:
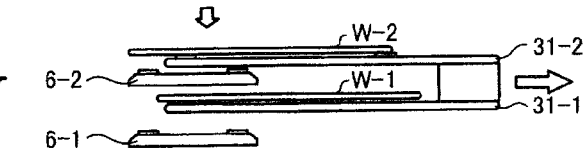

Then, as illustrated in FIG. 15I, the transfer device 1 retreats the first pick 31-1 and the second pick 31-2 from the orientor 5 (Step S306).

(Loading of Wafer into Load-Lock Chamber)

Figure 16:
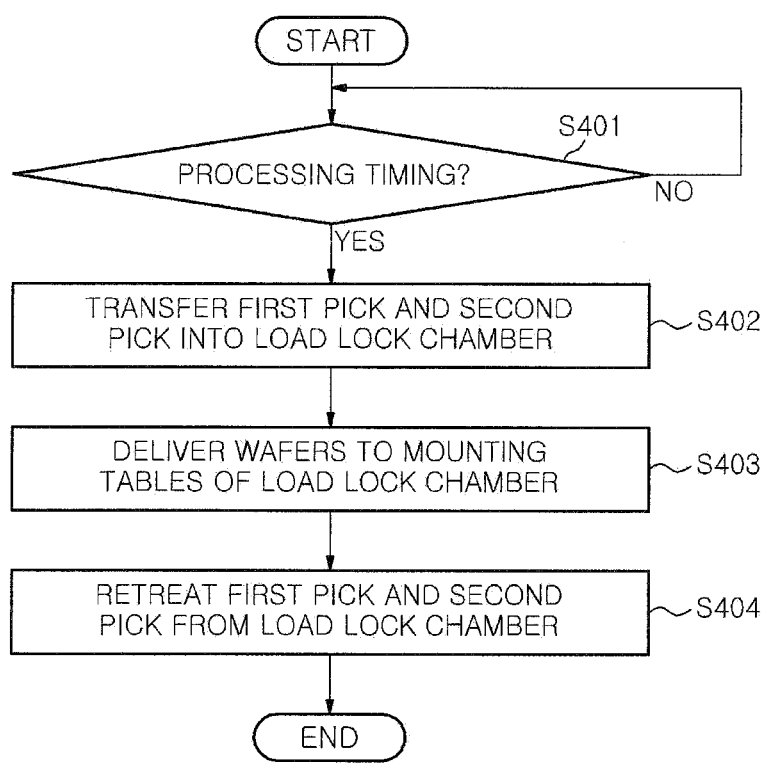
FIG. 16 is a flow chart illustrating one example of a flow of loading wafers into a load-lock chamber in the first embodiment.

FIG. 16 is a flow chart illustrating one example of a flow of loading of wafers into the load-lock chamber in the first embodiment. FIGS. 17A to 17E are views illustrating one example of a flow of loading of wafers into the load-lock chamber in the first embodiment.

Figure 17A:
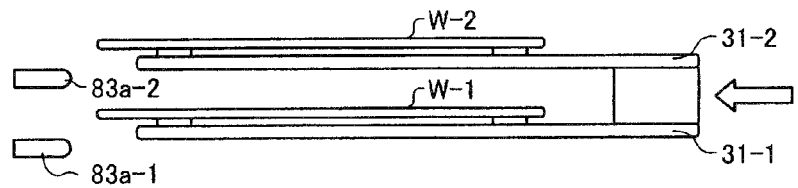
FIGS. 17A to 17E are views illustrating one example of a flow of loading wafers into the load-lock chamber in the first embodiment.
Figure 17B:
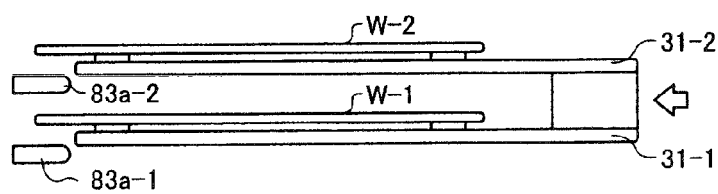

As illustrated in FIG. 16, at a process timing (Yes in Step S401), the transfer device 1 actuates the arm unit to put the first pick 31-1 and the second pick 31-2 into the load-lock chamber 83 (Step S402). That is, the transfer device 1 puts the first pick 31-1 and the second pick 31-2 into the load-lock chamber 83, as illustrated in FIG. 17A, and locates the first pick 31-1 and the second pick 31-2 below the mounting tables 83a-1 and 83a-2 of the load-lock chamber 83, respectively, as illustrated in FIG. 17B.

Figure 17C:
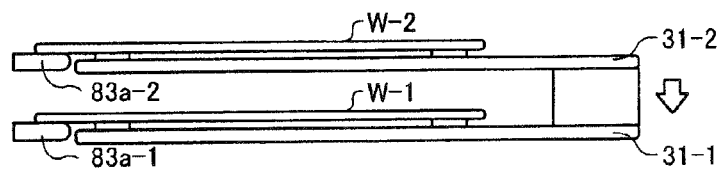
Figure 17D:
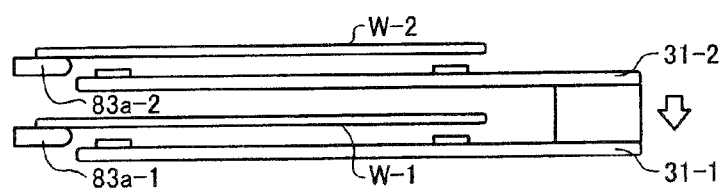

Then, the wafers W are delivered to the mounting tables 83a-1 and 83a-2 of the load-lock chamber 83 (Step S403). That is, as illustrated in FIG. 17C, by actuating the arm unit to descend the first pick 31-1 and the second pick 31-2 vertically, the transfer device 1 delivers the wafer W-1 and the wafer W-2 to the top surfaces of the mounting tables 83a-1 and 83a-2, respectively, as illustrated in FIG. 17D.

Figure 17E:
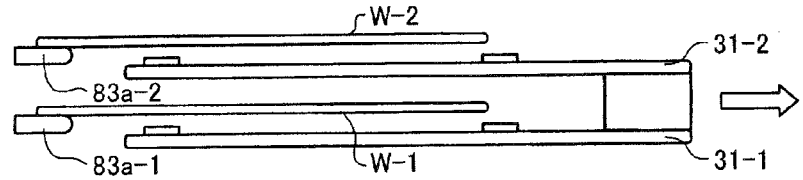

Then, as illustrated in FIG. 17E, the transfer device 1 retreats the first pick 31-1 and the second pick 31-2 from the load-lock chamber 83 (Step S404).

(Effects of First Embodiment)

As described above, according to the first embodiment, the wafer W-1 held on the first pick 31-1 and the second wafer W-2 held on the second pick 31-2 are respectively transferred to the first pedestal 6-1 and the second pedestal 6-2, the first wafer W-1 is received from the first pedestal 6-1 by locating the first pick 31-1 at the first reception position determined based on the alignment position determined by the first pedestal 6-1 and moving the first pick 31-1 upward, and the second wafer W-2 is received from the second pedestal 6-2 by locating the second pick 31-2 at the second reception position determined based on the alignment position determined by the second pedestal 6-2 and moving the second pick 31-2 upward. This can result in efficient position adjustment. For example, it is possible to reduce the number of times of expansion/contraction of an arm, thereby improving transfer capability.

In addition, according to the first embodiment, the first distance 31c is different from the second distance 6c. That is, for example, even when the orientor has one or more pedestals, according to the above-described embodiment, by making the second distance 6c corresponding to the holding distance of the wafers W in the orientor 5 different from the first distance 31c corresponding to the holding distance between the first pick 31-1 and the second pick 31-2, as compared to a case where wafers are delivered for each of a plurality of pedestals, delivery timings can be deviated from each other and pick positions of the wafers can be adjusted by moving the picks horizontally at the deviated timings. This can result in improvement of transfer capability.

That is, when a plurality of position detecting mechanisms is arranged and the position adjustment of the wafers W can be performed in parallel for the position detecting mechanisms, it is possible to efficiently perform exchange of the wafers W between the first pick 31-1 or the second pick 31-2 and the orientor 5. As a result, it is possible to perform efficient position adjustment and improve the transfer capability of the wafers W, as a method of performing position detection for each wafer.

In addition, by arranging the plurality of position detecting mechanisms vertically, it is possible to save a space and reduce costs, as compared to a case where the position detecting mechanisms is horizontally arranged and a plurality of wafers is horizontally lined up.

In addition, as described above, since a plurality of picks is provided for one arm unit, a common driving system can be used, which can result in reduction of costs and reliable movement of the plurality of picks.

In addition, according to the first embodiment, the first distance 31c corresponds to the holding distance between wafers W held in the substrate transfer container. This can result in efficient reception of the wafers W from the substrate transfer container C.

In addition, according to the first embodiment, the first distance 31c between the bottom surface of the first wafer W-1 held on the first pick 31-1 and the bottom surface of the second wafer W-2 held on the second pick 31-2 is different from the second distance 6c between the bottom surface of the first wafer W-1 held on the first pedestal 6-1 and the bottom surface of the second wafer W-2 held on the second pedestal 6-2. As a result, it is possible to realize a transfer device with efficient transfer capability.

In addition, according to the first embodiment, each of the first pick 31-1 and the second pick 31-2 has the first surface 31a serving as a surface for holding the wafers W and the second surface 31b opposite to the first surface 31a, the first pick 31-1 and the second pick 31-2 are arranged in the arm unit so as to be vertically spaced from each other the first distance 31c between the second surface 31b of the second pick 31-2 and the first surface 31a of the first pick 31-1, each of the first pedestal 6-1 and the second pedestal 6-2 has the third surface 6a serving as a surface for holding the wafers W and the fourth surface 6b opposite to the third surface 6a, and the first pedestal 6-1 and the second pedestal 6-2 are arranged to be vertically spaced from each other with the second distance 6c between the fourth surface 6b of the second pedestal 6-2 and the third surface 6a of the first pedestal 6-1. As a result, it is possible to realize a transfer device with efficient transfer capability.

(Other Embodiments)

Although the substrate transfer method and transfer device according to the first embodiment has been described in the above, the present invention is not limited thereto but may implement other substrate transfer methods and transfer devices by way of different embodiments.

For example, although it has been illustrated in the first embodiment that the first distance 31c is smaller than the second distance 6c, the present invention is not limited thereto. For example, the first distance 31c may be larger than the second distance 6c.

(Transfer Device)

In addition, for example, although it has been illustrated in the above embodiment that, in the transfer device 1, a plurality of picks is arranged in the same arm unit, the present invention is not limited thereto. For example, a plurality of picks may be arranged in different arm units.

(Detecting Mechanism)

In addition, for example, although it has been illustrated in the above embodiment that separate detecting mechanisms are provided for a plurality of pedestals, the present invention is not limited thereto. For example, some or all of the detecting mechanisms may be made common. As such one more detailed example, light from the same light emitting part 65 may be incident into the light receiving part 66 provided for each pedestal via a mirror or a prism.

(Location of Alignment)

In addition, although it has been illustrated in the above embodiment that the alignment is performed in the orientor 5 adjacent to the first transfer chamber 82 of the semiconductor manufacturing apparatus 8, the present invention is not limited thereto. For example, the alignment may be performed in the load-lock chamber 83 and the above-described delivery of wafers W may be performed for the alignment, or alternatively, a location for performing the alignment may be provided in the second transfer chamber 84 and then the above-described delivery of wafers W may be performed. The above-described delivery of wafers W for the alignment may be performed under vacuum environments or other non-vacuum embodiments.

(Pick)

In addition, although it has been illustrated in the above embodiment that the first pick 31-1 and the second pick 31-2 hold wafers W by control of an air flow rate, without being limited thereto, the wafers W may be held in other different manners. For example, the wafers W may be held by a vacuum chuck, electrostatic attraction or the like.

(Control Unit)

In addition, the various above-described control units may be a single common control unit.

(Semiconductor Manufacturing Apparatus)

In addition, although it has been illustrated in the above embodiment that the semiconductor manufacturing apparatus including the transfer device 1 is the multi-chamber system, without being limited thereto, the semiconductor manufacturing apparatus may be one of chamber systems other than the multi-chamber system.

What is claimed is:

1. A substrate transfer method comprising:
    a step of placing a first substrate and a second substrate on a first alignment part and a second alignment part which are arranged to be vertically spaced from each other, respectively, by using a first pick and a second pick for holding the first substrate and the second substrate to be vertically spaced from each other, respectively;
    a first positioning step of positioning the first pick at a first reception position determined based on an alignment position for the first substrate aligned by the first alignment part;
    a first receiving step of receiving the first substrate from the first alignment part by moving the first pick vertically;
    a second positioning step of positioning the second pick at a second reception position determined based on an alignment position for the second substrate aligned by the second alignment part; and
    a second receiving step of receiving the second substrate from the second alignment part by moving the second pick vertically;
    wherein a first distance between the bottom surface of the first substrate held on the first pick and the bottom surface of the second substrate held on the second pick is different from a second distance between the bottom surface of the first substrate placed on the first alignment part and the bottom surface of the second substrate placed on the second alignment part;
    wherein the second positioning step is performed by moving the first pick and the second pick horizontally in a state where the first pick holds the first substrate; and
    wherein the first pick and the second pick are provided on a same arm and are simultaneously moved in a same direction.

2. The substrate transfer method of claim 1, further comprising a retreating step of retreating the first and the second substrate from the first and second alignment part after performing the second receiving step in a state where the first and the second pick hold the first and the second substrate, respectively.

3. The substrate transfer method of claim 1, wherein the first distance is smaller than the second distance.

4. The substrate transfer method of claim 1, wherein the first distance is a minimal distance between the bottom surface of the first substrate and the bottom surface of the second substrate when the first substrate and the second substrate are held in a substrate transfer container.

5. The substrate transfer method of claim 1, wherein the second receiving step is performed by moving the first pick and the second pick vertically in a state where the first pick holds the first substrate.

6. The substrate transfer method of claim 5, further comprising a retreating step of retreating the first and the second substrate from the first and second alignment part after performing the second receiving step in a state where the first and the second pick hold the first and the second substrate, respectively.

\* \* \* \* \*